United States Patent
Cheng et al.

(10) Patent No.: US 7,321,196 B2
(45) Date of Patent: Jan. 22, 2008

(54) ORGANIC LIGHT EMITTING DIODE WITH TRANSPARENT ELECTRODE STRUCTURE HAVING DIELECTRIC LAYER

(75) Inventors: Jia-Shyong Cheng, Yangmei Town, Taoyuan County (TW); Chung-Chih Wu, Taipei (TW); Ping-Yuan Hsieh, Taipei (TW); Huo-Hsien Chiang, Taipei (TW); Chieh-Wei Chen, Fongyuan (TW)

(73) Assignees: HannStar Display Corporation, Yangmei Township (TW); National Taiwan University, Taipei (TW)

(*) Notice: Subject to any disclaimer, the term of this patent is extended or adjusted under 35 U.S.C. 154(b) by 279 days.

(21) Appl. No.: 10/903,678

(22) Filed: Jul. 30, 2004

(65) Prior Publication Data
US 2005/0088080 A1    Apr. 28, 2005

(30) Foreign Application Priority Data
Oct. 22, 2003  (TW) .............................. 92129361 A
Jan. 8, 2004   (TW) .............................. 93100486 A

(51) Int. Cl.
H01J 1/62     (2006.01)
H01J 63/04    (2006.01)

(52) U.S. Cl. .................. 313/504; 313/503; 313/506; 313/512; 428/690

(58) Field of Classification Search .......... 313/498, 313/502–504, 506, 509, 512; 428/690, 917
See application file for complete search history.

(56) References Cited

U.S. PATENT DOCUMENTS

| | | | |
|---|---|---|---|
| 5,703,436 A | 12/1997 | Forrest et al. | 313/506 |
| 5,714,838 A | 2/1998 | Haight et al. | 313/506 |
| 5,739,545 A | 4/1998 | Guha et al. | 257/40 |
| 5,776,623 A | 7/1998 | Hung et al. | 428/690 |
| 5,981,306 A | 11/1999 | Burrows et al. | 438/22 |
| 5,986,401 A | 11/1999 | Thompson et al. | 313/504 |
| 6,140,763 A | 10/2000 | Hung et al. | 313/503 |
| 6,264,805 B1 | 7/2001 | Forrest et al. | 204/192.26 |
| 6,366,017 B1* | 4/2002 | Antoniadis et al. | 313/506 |
| 6,383,666 B1* | 5/2002 | Kim et al. | 428/690 |
| 6,420,031 B1 | 7/2002 | Parthasarathy et al. | 428/411.1 |
| 6,447,934 B1* | 9/2002 | Suzuki et al. | 428/690 |
| 6,469,437 B1 | 10/2002 | Parthasarathy et al. | 313/504 |
| 6,476,550 B1* | 11/2002 | Oda et al. | 313/504 |
| 6,501,217 B2 | 12/2002 | Beierlein et al. | 313/504 |
| 6,534,202 B2* | 3/2003 | Sato et al. | 428/690 |
| 6,548,956 B2 | 4/2003 | Forrest et al. | 313/504 |

* cited by examiner

*Primary Examiner*—Nimeshkumar D. Patel
*Assistant Examiner*—Kevin Quarterman
(74) *Attorney, Agent, or Firm*—Volpe and Koenig, P.C.

(57) ABSTRACT

An organic light emitting diode is provided. The organic light emitting diode includes a substrate, an electrode structure formed on said substrate, an organic layer formed on said electrode structure and a transparent electrode structure having at least one transparent dielectric layer with a relatively higher refraction index and deposited on said organic layer by thermal evaporation.

27 Claims, 13 Drawing Sheets

α-NPD

TPD

Alq3

PEDOT    PSS m-MTDATA

40

ORGANIC LIGHT EMITTING DIODE WITH TRANSPARENT ELECTRODE STRUCTURE HAVING DIELECTRIC LAYER

FIELD OF THE INVENTION

The present invention relates to an organic light emitting diode, and more particularly to an electrode structure of an organic light emitting diode.

BACKGROUND OF THE INVENTION

Generally, the organic light emitting diode (OLED) is formed by depositing the organic thin films between the upper metal cathode and the bottom transparent anode. The OLED is manufactured on the transparent substrate, e.g. the glass, and the transparent anode is made of the transparent conductor such as the indium tin oxide (ITO). Please refer to FIG. 1, which is a typical organic light emitting diode with multiple heterogeneous structures. The organic light emitting diode comprises the anode 11, the cathode 17 and a plurality of organic layers with the hole injection layer 12, the hole transport layer 13, the emitting layer 14, the electron transport layer 15, and the electron injection layer 16. Such conventional organic light emitting diode belongs to the bottom-emitting OLED. When applying the bias voltage to the layers 1216 between the anode 11 and the cathode 17, the light is emitted through the transparent anode 11 and the substrate (not shown). Please refer to FIGS. 2(a) and 2(b). FIG. 2(a) shows some typical materials of the hole transport layer such as α-naphtylphenylbiphenyl diamine (α-NPD) and 1,1,4,4-tetra phenyl-1,3-butadiene (TPD), and the typical material of the electron transport layer and the green-fluorescence emitting layer such as tris(8-hydroxyquinolino) aluminum (Alq3). FIG. 2(b) shows the typical materials of the hole injection layer 12 such as polyethylene dioxythiophene:polystyrene sulphonate (PEDOT:PSS) and 4,4', 4"-tris(3-methylphenylphenylamino)triphenylamine (m-MTDATA).

In some OLED applications, such as the ones applied on the silicon-chip substrates or other opaque substrates, the top-emitting OLED is desired. Since the light must be emitted from the top surface of the top-emitting OLED, the cathode on the top of the OLED should be transparent or translucent. Furthermore, in some other OLED applications, the OLED must be transparent so that the light could transmit the OLED. Hence, in addition to the transparence of the anode, the cathode on the top of the OLED should be transparent or translucent.

Moreover, in active matrix OLED displays (AMOLEDs), the transistor driver circuit of each pixel has to be integrated with the OLED. However, the light of the conventional OLED from the organic layers thereof is emitted downward via the transparent substrate and the ITO. Therefore, the emitting area is limited due to the covering by the driver circuit on the substrate. For this reason, the top-emitting OLED is desired so as to improve the filling factor of the AMOLED to approach to 100% and to prevent the influence by the covering area of the transistor (especially when the driver circuit is complicated). On one hand, the top-emitting OLED is capable of improving the image quality and the properties of the displays, and on the other hand, the top-emitting OLED is capable of increasing the design flexibility of the AMOLED in designing the driver circuit of the AMOLED. As described above, with the top-emitting OLED, it is possible to design the driver circuit with better functions (e.g. resolution) and properties.

At the present day, there are two major methods for manufacturing the transparent or translucent cathode:
(1) The top transparent cathode is formed by sputtering transparent ITO or other transparent metal oxide conductors with some proper electron injection layers.
(2) The top transparent cathode is formed by the thin metal layer (usually with a thickness less than a few tens of nanometers).

The first method is disclosed in U.S. Pat. No. 6,548,956, U.S. Pat. No. 6,469,437, U.S. Pat. No. 6,420,031, U.S. Pat. No. 6,264,805, U.S. Pat. No. 5,986,401, U.S. Pat. No. 5,981,306, U.S. Pat. No. 5,703,436, U.S. Pat. No. 6,140,763 and U.S. Pat. No. 5,776,623. Because the deposited organic layer is easily damaged during the sputtering process, sputtering ITO or other transparent metal oxide conductors on the organic layer is relatively difficult to control. Besides, the power of the sputtering should be as low as possible so as to prevent the thin film already deposited underneath from being damaged. Therefore, the processing time is prolonged. Moreover, the conductivities of most transparent metal oxide conductors are substantially less than those of the metals. Thus, the transparent metal oxide conductors have higher resistance than metals.

The second method is to utilize the thin metal layer (usually with a thickness less than a few tens of nanometers) as the translucent cathode. The thin metal layer not only has better conductivity, but also is more easily made on other organic layers. However, the major problem of using the thin metal layer as the translucent cathode is that the light transmission is lower. For example, the light transmission of the Ag layer of 20 nm is only 30%. The light transmission of the Al layer of 20 nm is even lower. The light transmission of the layer composed of the Ca layer of 12 nm and the Mg layer of 12 nm is only 40-50%.

The method of depositing the transparent dielectric layer on the thin metal layer for improving the light transmission of the cathode is disclosed in U.S. Pat. No. 5,739,545, U.S. Pat. No. 6,501,217 and U.S. Pat. No. 5,714,838. The whole cathode structure includes the thin metal layer having the high activity and the low work function such as Ca, Mg, Sr, Li or the stacks thereof, and the transparent dielectric or large bandgap semiconductor such as ZnSe, ZnS or GaN upon the thin metal layer. All materials in the disclosed patents are desired to be deposited by thermal evaporation so as to simplify the manufacturing processes and improve the compliance of the process. However, the major problem of such cathode is that the utilized metal has high activity and reactivity such as Ca, Mg, Sr or Li, that is disadvantageous for the environmental stabilization of the components.

In view of the above, the transparent cathode of the OLED made of the thin metal layer has better efficiency and compliance for the processing. In order to improve the problem of the lower light transmission, the transparent dielectric should be stacked upon the thin metal layer for acquiring higher light transmission. The problems of the conventional technology include that the utilized metal belongs to unstable metal with high activity, or the transparent dielectric with high refractive-index value could not be deposited by thermal evaporation.

Moreover, no matter what conductive material is used for the anode of the OLED, usually there is a problem with the hole injection. Because the difference between the work function of the conductive material and the ionization potential (IP) of the organic opto-electronic materials is disadvantageous for the hole injecting from the anode to the organic layer. Therefore, this has an effect on the opto electronic properties of the top-emitting OLED.

Hence, an OLED having an electrode structure with a matched energy level helpful to inject the hole to the organic hole transport layer is needed. And as mentioned previously, a new OLED with the translucent cathode structure formed by depositing the metal with lower activity and transparent dielectric material via thermal evaporation is also desired.

SUMMARY OF THE INVENTION

It is an object of the present invention to provide an organic light emitting diode (OLED). The principal part of the transparent cathode is the transparent dielectric layer with the relatively higher refraction index collocating with the thin metal layer. The transparent cathode of the OLED of the present invention has better manufacturing processes, compliance and relatively higher optical transmission.

It is a further object of the present invention to provide another organic light emitting diode (OLED). The anode of the OLED of the present invention can improve the optoelectronic properties of the top-emitting OLED, so as to broaden the scopes of the OLED applications.

In accordance with one aspect of the present invention, the organic light emitting diode comprises a substrate, an electrode structure deposited on the substrate, an organic layer deposited on the electrode structure, and a transparent electrode structure deposited on the organic layer by thermal evaporation, wherein the transparent electrode structure has at least one transparent dielectric layer with a rather high refraction index.

In accordance with another aspect of the present invention, the organic light emitting diode includes a substrate, a first electrode structure deposited on the substrate and having at least a metal layer and an opaque metal oxide layer, an organic layer deposited on the first electrode structure, and a second electrode structure deposited on the organic layer.

In accordance with another aspect of the present invention, the organic light emitting diode includes a substrate, a metal layer deposited on said substrate, a metal oxide layer deposited on said metal layer and formed by oxidizing a surface of said metal layer, an organic layer deposited on said metal oxide layer, and an electrode structure deposited on said organic layer.

The foregoing and other features and advantages of the present invention will be more clearly understood through the following descriptions with reference to the drawings, wherein:

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
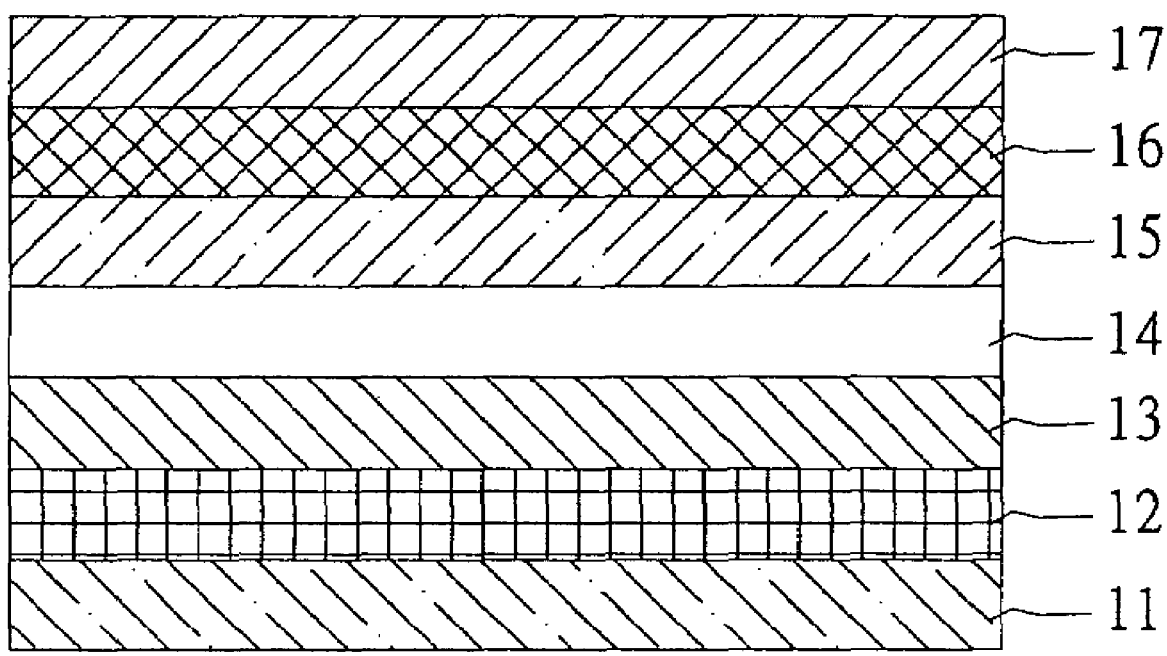
FIG. 1 is a diagram showing the structure of the bottom-emitting OLED according to the prior art.
Figure 2A:
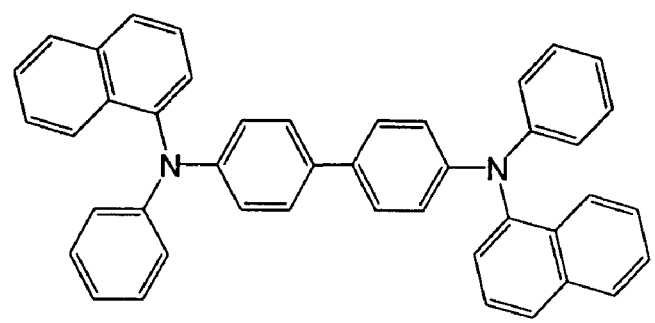
FIG. 2(a) is a diagram showing the structures of α-NPD and TPD which are the materials of the hole transport layer and the structure of Alq3 which is the material of the green-fluorescence emitting layer and the electron transport layer according to the prior art.
Figure 2A:
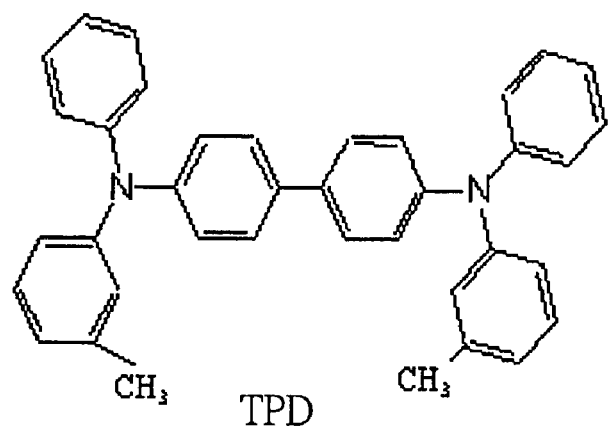
Figure 2A:
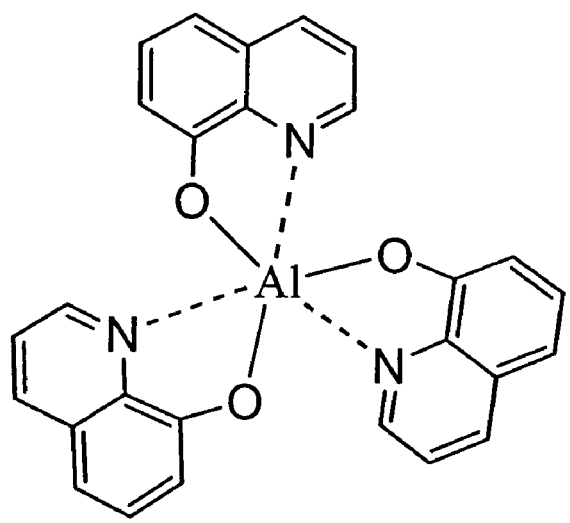
Figure 2B:
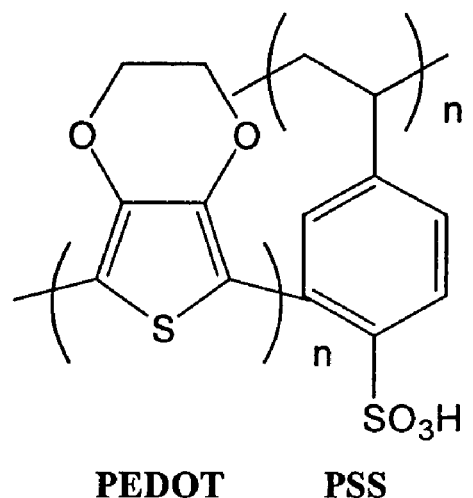
FIG. 2(b) is a diagram showing the structures of PEDOT:PSS and m-MTDATA, the conducting polymers, which are the materials of the hole injection layer according to the prior art.
Figure 2B:
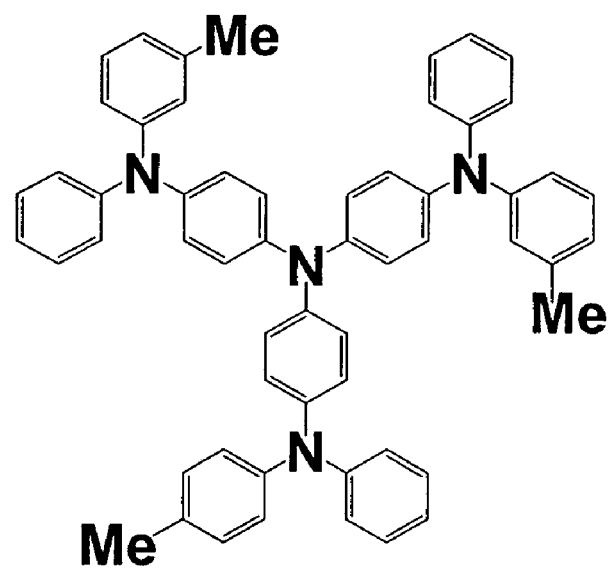
Figure 3:
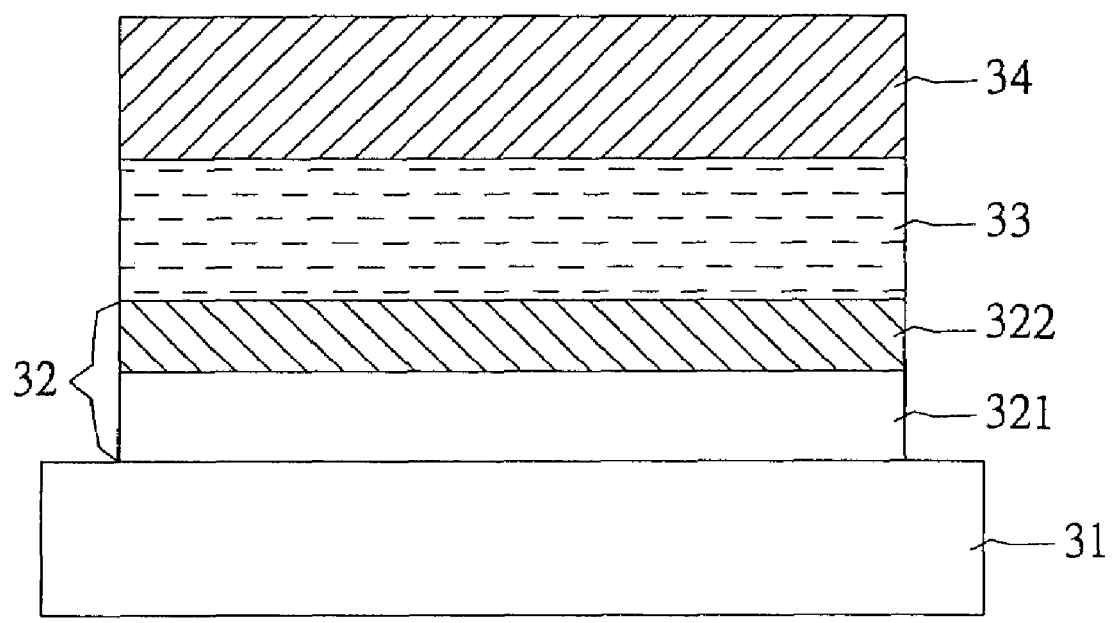
FIG. 3 is a diagram showing the OLED according to a preferred embodiment of the present invention.

Please refer to FIG. 3, which is a diagram showing the OLED having the transparent cathode according to a preferred embodiment of the present invention. The OLED includes the substrate 31, the anode 32, the organic layer 33 and the transparent cathode 34. The anode 32 is deposited on the substrate 31. The organic layer 33 is deposited on the anode 32. The transparent cathode 34 is deposited on the organic layer 33. The anode 32 is made of the metal layer 321 and the metal oxide, e.g. $AgO_x$, layer 322 having a thickness ranged between 0.1 and 50 nm deposited on the metal layer 321. Take $Ag_2O$ for example, because the $Ag_2O$ has the bandgap of 1.3 eV, the ionization potential (IP) of 5.3 eV which is 1 eV higher than the work function of Ag, and the properties of the p-type semiconductor with the Fermi level ranging from 4.8 to 5.1 eV, which match with the energy level of the material of the hole transport layer of the OLED, the luminance of the OLED and the hole injection would be substantially enhanced under the same voltage operation. And the anode with metal oxide, $Ag_2O$, retains a high reflectance of 82%-91% over the visible range. Moreover, the metal oxide layer 322 could be formed by chemical vapor deposition (CVD), sputtering deposition (including reactive sputtering deposition), thermal evaporation, electron-beam evaporation, oxygen plasma oxidation, oxygen environment oxidation, UV-ozone treatment oxidation, wet chemical oxidation or electrochemical oxidation.

The aforementioned UV-ozone treatment oxidation is to convert the oxygen in the atmosphere into the ozone and the oxygen atom by utilizing the UV light wavelength of 254 nm generated by the low pressure quartz mercury vapor lamp. Then the metal oxide layer would be formed by the thin metal film exposed to the condition. For example,

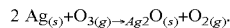

The substrate 31 of the OLED according to the present invention could be the transparent substrate such as the glass, the quartz and the plastic. The substrate 31 of the OLED according g to the present invention also could be the opaque substrate such as the silicon chip and the GaAs chip.

The metal layer 321 of the OLED according to the present invention could be one selected from a group with rather high reflectivity consisting of layers of Ag, Au, Al, Cu, Mo, Ti, Pt, Ir, Ni and Cr, stack layers thereof and a layer of a mixture thereof.

The organic layer 33 of the OLED according to the present invention could be a single layer structure with the functions of the charge transport and the luminance. The organic layer 33 of the OLED according to the present invention could be multiple layers, too. For example, it could be respectively formed by the following different methods: (1) depositing the hole transport layer and the electron transport layer (as the luminance layer) in sequence on top of the electrode; (2) depositing the hole transport layer (as the luminance layer) and the electron transport layer in sequence on top of the electrode; (3) depositing the hole transport layer, the luminance layer and the electron transport layer in sequence of top of the electrode. Other possible structures and the materials of the organic layer of the OLED according to the present invention could be found in the prior references and patents.

The transparent cathode 34 of the OLED according to the present invention could be made of one metal selected from a group with rather high reflectivity consisting of Mg, Ca, Al, Ba, Li, Be, Sr, Ag, and Au, the stack thereof and a mixture thereof. The transparent cathode 34 of the OLED according to the present invention also could be the metal material collocating with the electron injection layer which is typically the alkali-salt layer. For example, the transparent cathode 34 is Al, which could be collocated with the electron injection layer made of LiF, $LiO_2$, NaCl, stack layers thereof or a layer of a mixture thereof. The cathode 34 of the OLED according to the present invention could be the transparent electrode which is made of one material selected from a group consisting of indium tin oxide (ITO), indium zinc oxide (IZO), indium oxide, tin oxide, zinc oxide, aluminum zinc oxide (AZO), and tellurium oxide, a stack thereof and a mixture thereof.

Figure 4:
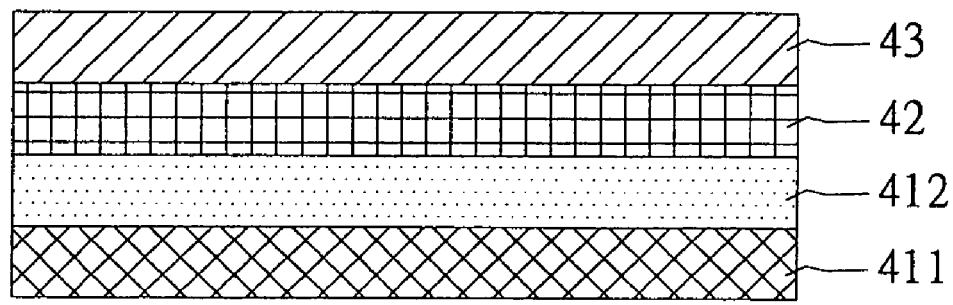
FIG. 4 is a diagram showing the transparent cathode according to a preferred embodiment of the present invention.

Please refer to FIG. 4, a diagram showing the transparent cathode according to a preferred embodiment of the present invention. The transparent cathode 40 includes the LiF layer 411, the Al layer 412, the Ag layer 42 and the $TeO_2$ layer 43. The LiF layer 411 has a thickness ranged between 0.1 and 4 nm. The Al layer 412 is deposited on the LiF layer 411 and has a thickness ranged between 0.1 and 4 nm. The Ag layer 42 is deposited on the Al layer 412 and has a thickness ranged between 5 and 40 nm. And the $TeO_2$ layer 43 is deposited on the Ag layer 42. The LiF layer 411 is collocated with the Al layer 412 as the electron injecting layer for increasing the electron injecting from the cathode to the organic layer underneath (not shown). The $TeO_2$ layer 43 is a transparent dielectric with a relatively higher refraction index ranged between 2.0 and 2.5. Besides, the $TeO_2$ layer 43 could be deposited by thermal evaporation so as to simplify the manufacturing processes and improve the compliance of the processes. Moreover, the $TeO_2$ layer 43 deposited on the LiF layer 411/the Al layer 412/the Ag layer 413 could be used to increase the light transmission of the transparent cathode 40. In other words, since the $TeO_2$ layer 43 with higher refraction index than that of the typical dielectric could be deposited on the low activity Ag layer 42 by thermal evaporation, the transparent cathode 40 with better light transmission could be applied to the top-emitting OLED.

Figure 5:
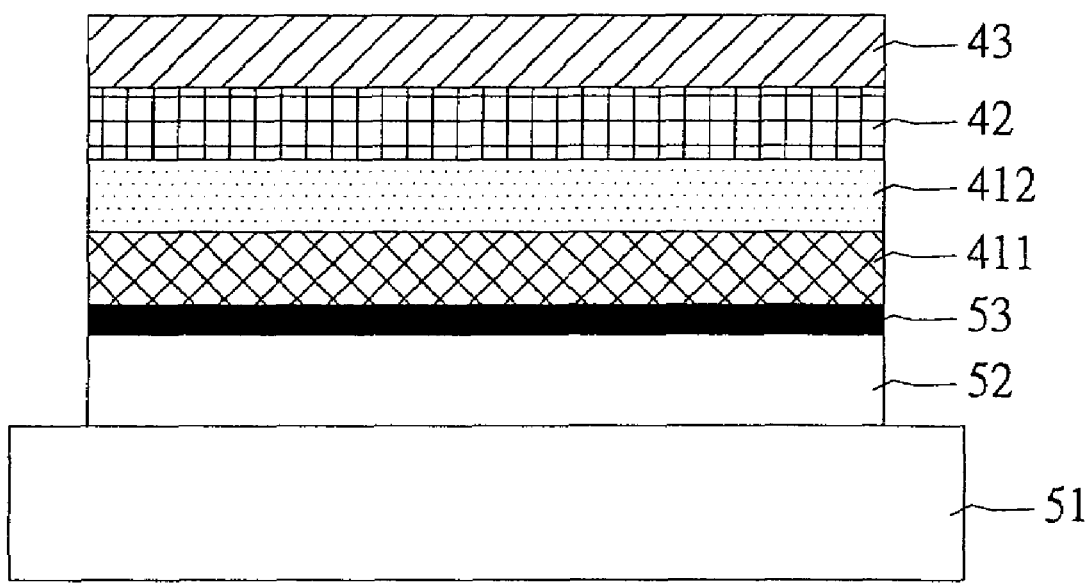
FIG. 5 is a diagram showing the OLED having the transparent cathode according to a further preferred embodiment of the present invention.

Please refer to FIG. 5, which is a diagram showing the OLED having the transparent cathode according to a further preferred embodiment of the present invention. The OLED 50 includes the substrate 51, the anode 52, the organic layer 53, the LiF layer 411, the Al layer 412, the Ag layer 42 and the $TeO_2$ layer 43. The anode 52 is deposited on the substrate 51. The organic layer 53 is deposited on the anode 52. The LiF layer 411 is deposited on the organic layer 53 and has a thickness ranged between 0.1 and 4 nm. The Al layer 412 is deposited on the LiF layer 411 and has a thickness ranged between 0.1 and 4 nm. The Ag layer 42 is deposited on the Al layer 412 and has a thickness ranged between 5 and 40 nm. And the $TeO_2$ layer 43 is deposited on the Ag layer 42. Please refer to FIGS. 4 and 5, the LiF layer 411 is collocated with the Al layer 412 as the electron injecting layer for improving the electron injecting from the cathode 40 to organic layer 53 underneath. The $TeO_2$ layer 43 is a transparent dielectric with a relatively higher refraction index ranged between 2.0 and 2.5. Besides, the $TeO_2$ layer 43 could be deposited by thermal evaporation. The light transmission of the transparent cathode 40 could be increased by depositing the $TeO_2$ layer 43 on the LiF layer 411/the Al layer 412/the Ag layer 42.

The anode 52 could be the conductive transparent metal oxide layer. The conductive transparent metal oxide layer is one selected from a group consisting of layers of indium tin oxide (ITO), indium zinc oxide (IZO), indium oxide, tin oxide, zinc oxide, aluminum zinc oxide (AZO), and tellurium oxide.

In addition, the anode 52 could be the stack layers or a layer of a mixture of the conductive polymer layer deposited on the aforementioned conductive transparent metal oxide layer. The conductive polymer layer is one selected from a group consisting of layers of polyethylene dioxythiophene/polystyrene sulphonate (PEDOT/PSS), 4,4',4"-tris(3-methylphenylphenylamino)triphenylamine (m-MTDATA), and polyaniline (PANI), stack layers thereof and a layer of a mixture thereof.

Further, the anode 52 could also be the stack layers or a layer of a mixture of the metal oxide layer deposited on the conductive metal layer. The conductive metal layer is one selected from a group with rather high reflectivity consisting of layers of Ag, Au, Al, Cu, Mo, Ti, Pt, Ir, Ni and Cr, stack layers thereof and a layer of a mixture thereof. The metal oxide layer is one selected from a group consisting of layers of the oxide of the aforementioned metal, stack layers thereof and a layer of a mixture thereof.

The metal oxide layer, such as $AgO_x$, mentioned above has a thickness of ranged between 0.1 and 50 nm. The metal oxide layer could be formed by one selected from a group consisting of chemical vapor deposition (CVD), sputtering deposition (including reactive sputtering deposition), thermal evaporation, electron-beam evaporation, oxygen plasma oxidation, oxygen environment oxidation, UV-ozone treatment oxidation, wet chemical oxidation and electrochemical oxidation.

Furthermore, the anode 52 could also be the stack layers or a layer of a mixture of the conductive transparent metal oxide layer deposited on the conductive metal layer. The conductive metal layer is made of one selected from a group consisting of layers of Ag, Au, Al, Cu, Mo, Ti, Pt, Ir, Ni and Cr, stack layers thereof and a layer of a mixture thereof. The conductive transparent metal oxide layer is one selected from a group consisting of layers of indium tin oxide (ITO), indium zinc oxide (IZO), indium oxide, tin oxide, zinc oxide, aluminum zinc oxide (AZO), and tellurium oxide, stack layers thereof and a layer of a mixture thereof.

The anode 52 could also be the stack layers or a layer of a mixture of the conductive polymer layer deposited on the conductive metal layer. The conductive metal layer is one selected from a group consisting of layers of Ag, Au, Al, Cu, Mo, Ti, Pt, Ir, Ni and Cr, stack layers thereof and a layer of a mixture thereof. The conductive polymer layer is one selected from a group consisting of layers of polyethylene dioxythiophene/polystyrene sulphonate (PEDOT/PSS), 4,4',4"-tris(3-methylphenylphenylamino)triphenylamine (m-MTDATA), and polyaniline (PANI), stack layers thereof and a layer of a mixture thereof.

The anode 52 could also be the stack layers or a layer of a mixture of the conductive metal layer, the metal oxide layer and the conductive polymer layer deposited sequentially. The conductive metal layer is one selected from a group consisting of layers of Ag, Au, Al, Cu, Mo, Ti, Pt, Ir, Ni and Cr, stack layers thereof and a layer of a mixture thereof. The metal oxide layer is one selected from a group consisting of layers of the oxide of the aforementioned metal, stack layers thereof and a layer of a mixture thereof. The conductive polymer layer is one selected from a group consisting of layers of polyethylene dioxythiophene/polystyrene sulphonate (PEDOT/PSS), 4,4',4"-tris(3-methylphenylphenylamino)triphenylamine (m-MTDATA), and polyaniline (PANI), stack layers thereof and a layer of a mixture thereof.

The organic layer 53 could be the single layer structure with the functions of the charge transport and the luminance. The organic layer 53 could also be multiple layers. For example, it could be respectively formed by the following different methods: (1) depositing the hole transport layer and the electron transport layer (as the luminance layer) in sequence on top of the electrode; (2) depositing the hole transport layer (as the luminance layer) and the electron transport layer in sequence on top of the electrode; (3) depositing the hole transport layer, the luminance layer and the electron transport layer in sequence on top of the electrode.

Therefore, applying the transparent cathode according to the present invention to the top-emitting OLED is advantageous to increase the light transmission, simplify the manufacturing processes and improve the compliance of the processes. Moreover, it is also advantageous to improve image quality and the properties of the displays, and to increase the flexibility while designing the driver circuit. Accordingly, the driver circuit with better functions (e.g. resolution) and properties could be designed.

According to a further preferred embodiment of the present invention, the following OLED could be made of:

the glass substrate/the Ag layer (80 nm)/the ITO layer (5.8 nm)/the α-NPD layer (50 nm)/the Alq3 layer (60 nm)/the LiF layer (0.5 nm)/the Al layer (0.6 nm)/the Ag layer (15 nm)/the TeO$_2$ layer (40 nm)

The Ag layer on top of the glass substrate and the ITO deposited thereon could be used as the anode. The α-NPD layer could be the organic hole transport layer. The Alq3 layer could be the organic electron transport layer and the green-fluorescence emitting layer. The LiF layer (0.5 nm)/the Al layer (0.6 nm)/the Ag layer (15 nm)/the TeO$_2$ layer (40 nm) could be the transparent cathode. The anode including the Ag layer and the ITO layer deposited thereon is used as the reflection anode. The light of the OLED is emitted from the top transparent cathode.

Figure 6:
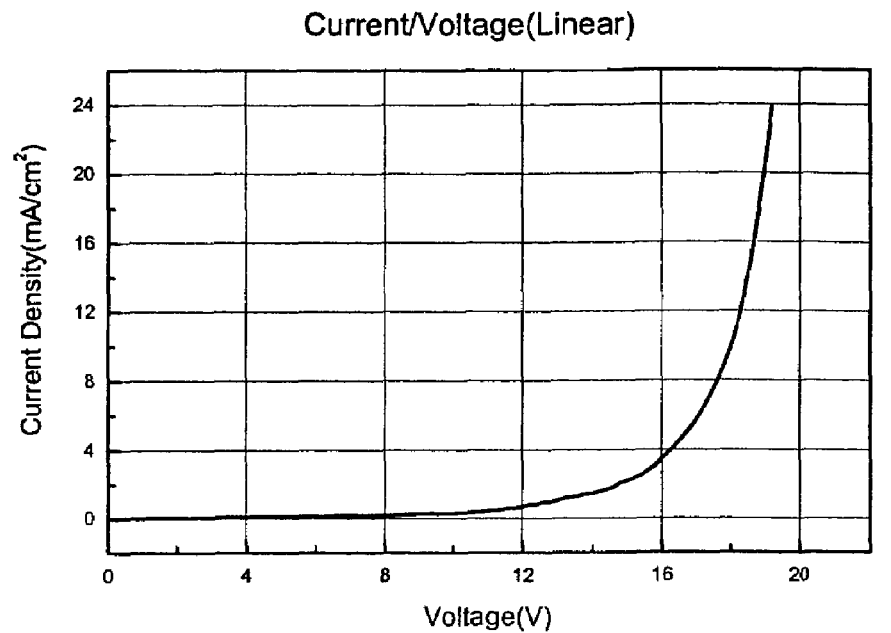
FIG. 6 is a diagram showing the electric characteristic curves of the OLED according to a further preferred embodiment of the present invention.
Figure 6:
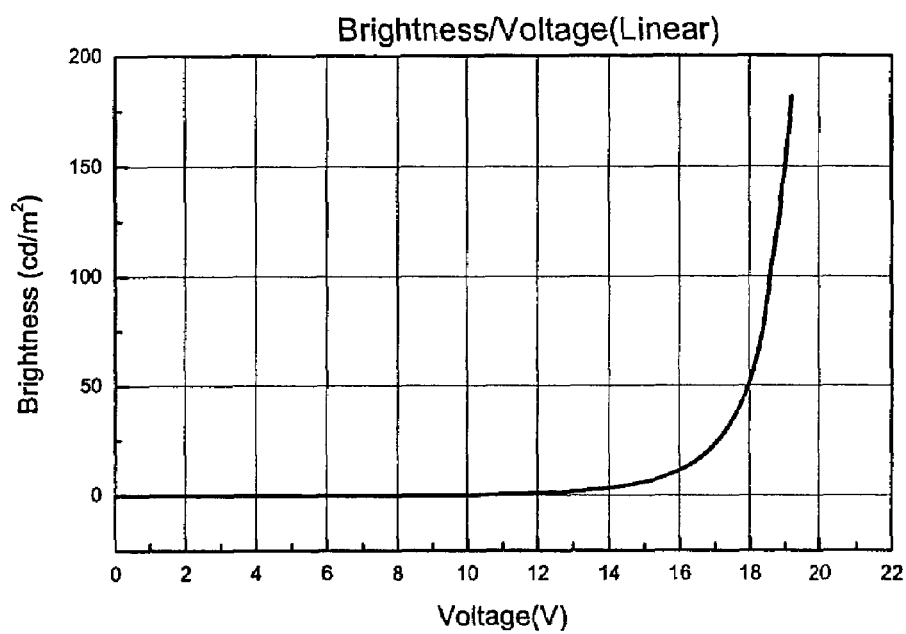
Figure 7:
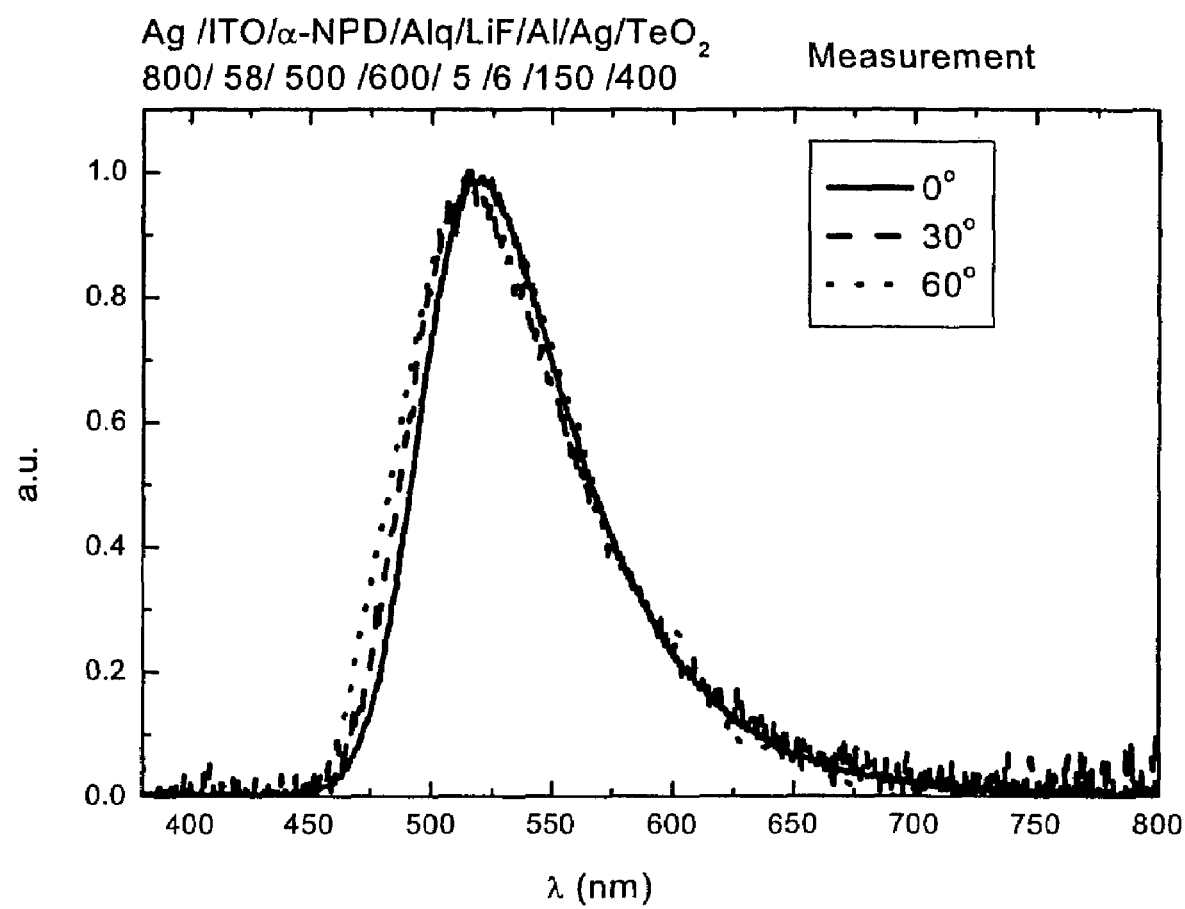
FIG. 7 is a diagram showing the spectrum measurements with different angles of the OLED according to a further preferred embodiment of the present invention, wherein the peak values have been normalized.

FIG. 6 shows the electric characteristic curves of the aforementioned OLED. FIG. 7 shows EL spectra with different view angles of the aforementioned OLED, wherein the peak values have been normalized. It can be seen that even the view angle reaches 60° off the surface normal, there is still no obvious changes in the spectrum and the hue is still green which is the original hue of the Alq3.

While the aforementioned OLED is tested, it is found that the lateral conductivity of the extremely thin ITO layer is very low. Therefore, even though the ITO is deposited completely without patterning, there is still no crosstalk occurred between two adjacent OLEDs. In other words, it is possible to omit the patterning process for the ITO layer by applying such structure to the AMOLED. Hence, the ITO injection layer could be collocated with any metal layers.

Figure 8:
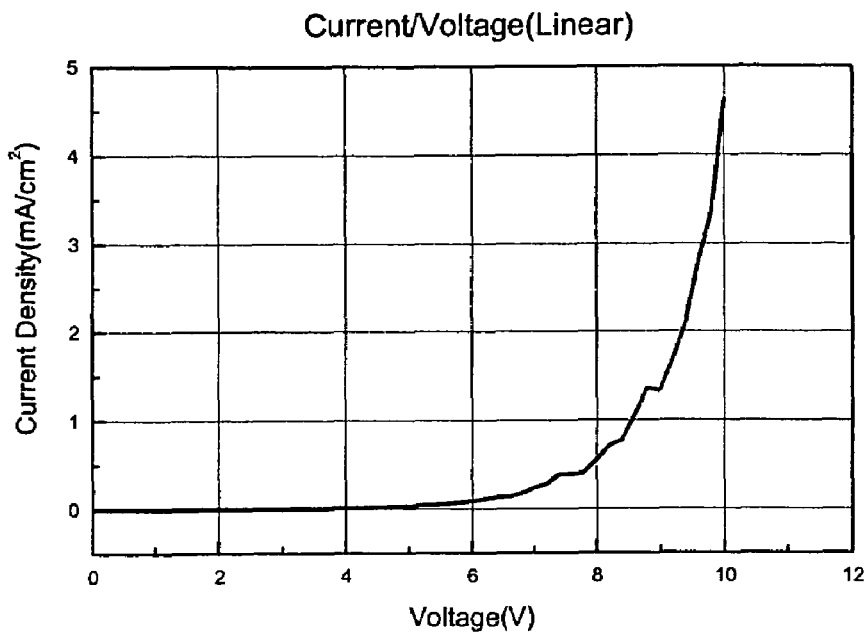
FIG. 8 is a diagram showing the electric characteristic curves of the OLED according to a further preferred embodiment of the present invention.
Figure 8:
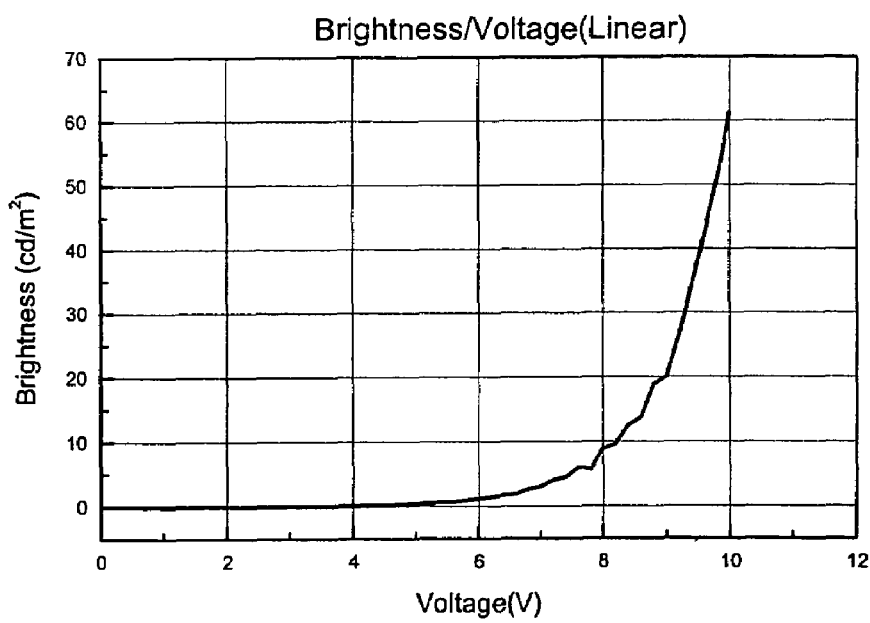

According to a further preferred embodiment of the present invention, the following OLED could be made of:

the glass substrate/the Al layer (150 nm)/the ITO layer (30 nm)/the PEDOT:PSS layer (25 nm)/the α-NPD layer (30 nm)/the Alq3 layer (70 nm)/the LiF layer (0.5 nm)/the Al layer (0.6 nm)/the Ag layer (15 nm)/the TeO$_2$ (32 nm) layer The Al layer on top of the glass substrate, the ITO layer deposited thereon and the PEDOT:PSS layer could be used as the anode. The α-NPD layer could be the organic hole transport layer. The Alq3 layer could be the organic electron transport layer and the green-fluorescence emitting layer. The LiF layer (0.5 nm)/the Al layer (0.6 nm)/the Ag layer (15 nm)/the TeO$_2$ layer (32 nm) could be used as the transparent cathode. The anode including the Al layer and the ITO layer deposited thereon is the reflection anode. The light of the OLED is emitted from the top transparent cathode. The electric characteristic curves of the aforementioned OLED is shown in FIG. 8.

According to a further preferred embodiment of the present invention, the following OLED could be made of:

the glass substrate/the Ag layer (150 nm)/the PEDOT:PSS layer (20 nm)/the α-NPD layer (30 nm)/the Alq3 layer (70 nm)/the LiF layer (0.5 nm)/the Al layer (0.6 nm)/the Ag layer (15 nm)/the TeO$_2$ layer (32 nm)

Figure 9:
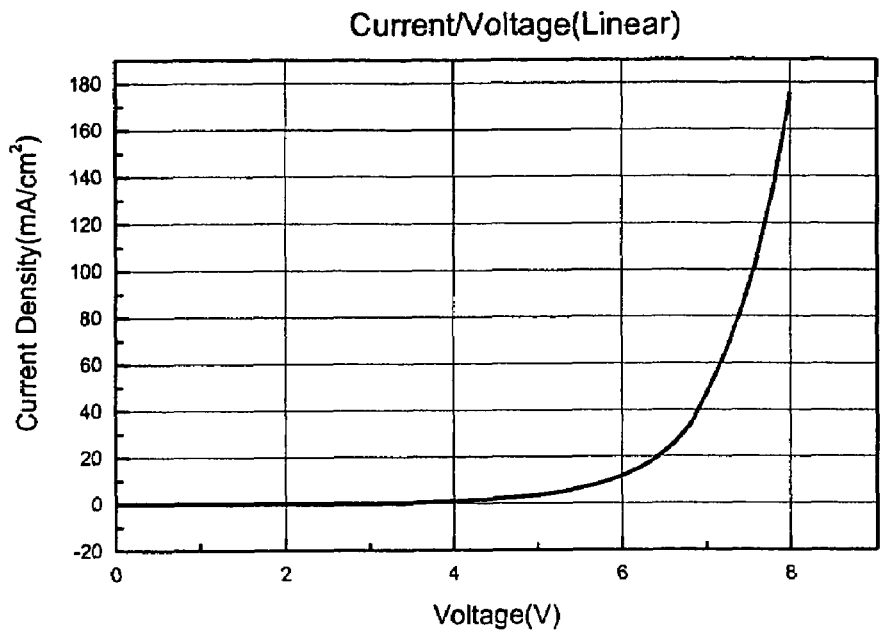
FIG. 9 is a diagram showing the electric characteristic curves of the OLED according to a further preferred embodiment of the present invention.
Figure 9:
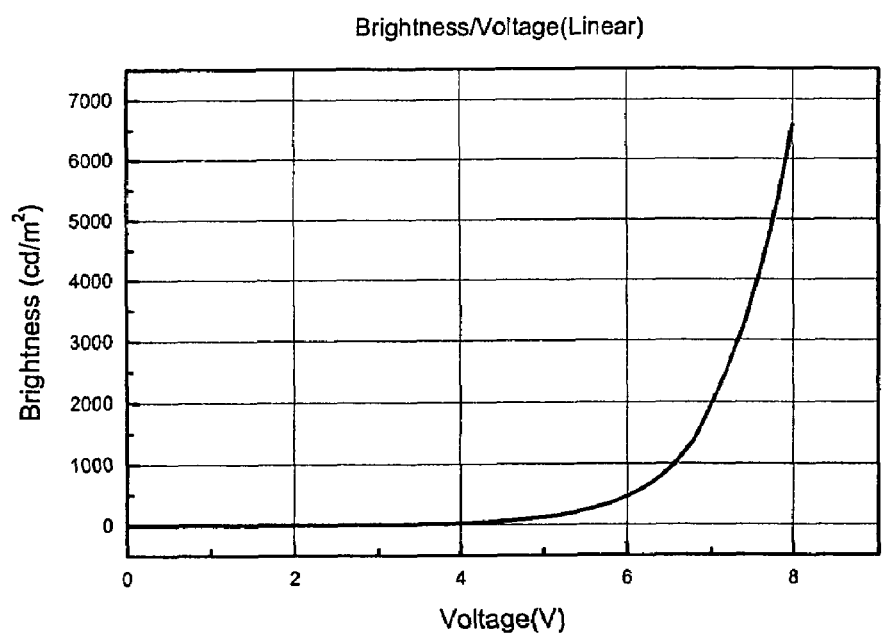

The Ag layer on top of the glass substrate and the PEDOT:PSS layer mounted thereon could be used as the anode. The α-NPD layer could be the organic hole transport layer. The Alq3 layer could be the organic electron transport layer and the green-fluorescence emitting layer. The LiF layer (0.5 nm)/the Al layer (0.6 nm)/the Ag layer (15 nm)/the TeO$_2$ layer (32 nm) could be the transparent cathode. The anode including the Ag layer and the PEDOT:PSS layer deposited thereon is the reflection anode. The light of the OLED is emitted from the top transparent cathode. The electric characteristic curves of the aforementioned OLED is shown in FIG. 9.

Figure 10:
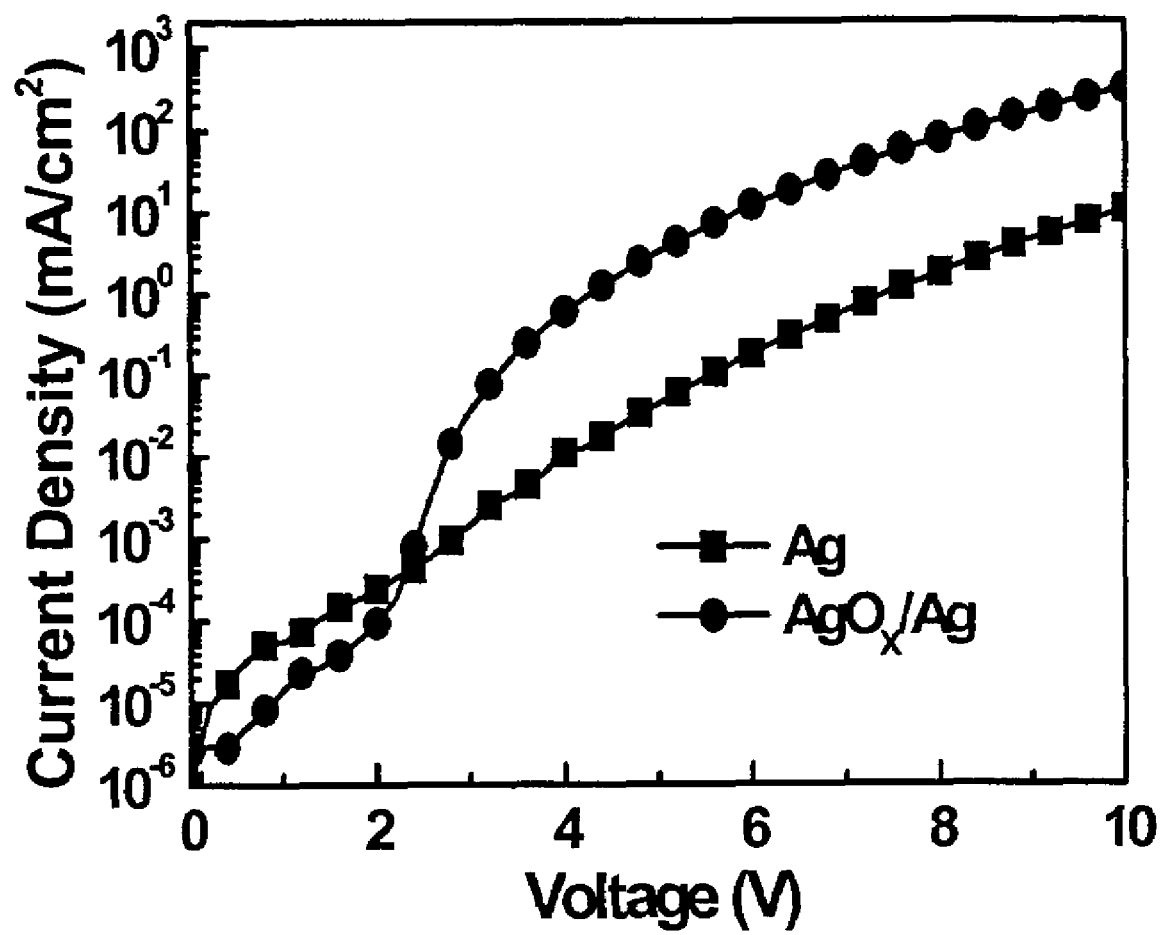
FIG. 10 is a diagram showing the voltage-current characteristic curves of the OLED using the Ag anode without $AgO_x$ (■) and with $AgO_x$ (●) according to a preferred embodiment of the present invention.

Please refer to FIG. 10, which is the diagram showing the voltage-current characteristic curves of the OLED 1 (without a AgO$_x$ layer) and the OLED 2 (with a AgO$_x$ layer) according to the preferred embodiments of the present application, in which:

OLED 1: the glass substrate/the Ag layer (80 nm)/the m-MTDATA layer (30 nm)/the α-NPD layer (20 nm)/the Alq3 layer (50 nm)/the LiF layer (0.5 nm)/the Al layer (1 nm)/the Ag layer (20 nm)/the TeO$_2$ layer (40 nm)

OLED 2: the glass substrate/the Ag layer (80 nm)/the AgO$_x$ layer/the m-MTDATA layer (30 nm)/the α-NPD layer (20 nm)/the Alq3 layer (50 nm)/the LiF layer (0.5 nm)/the Al layer (1 nm)/the Ag layer (20 nm)/the TeO$_2$ layer (40 nm)

Figure 11:
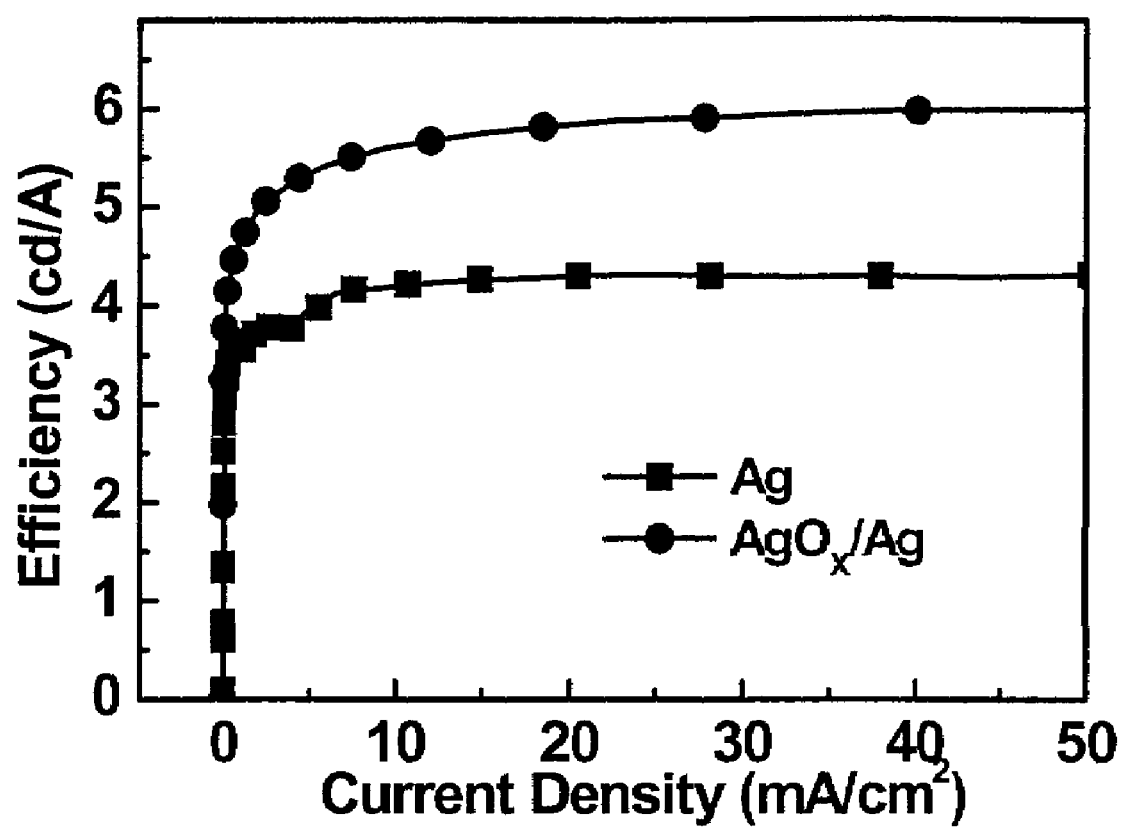
FIG. 11 is a diagram showing the luminance efficiency-current characteristic curves of the OLED using the Ag anode without $AgO_x$ (■) and with $AgO_x$ (●) according to a preferred embodiment of the present invention.

The Ag layer on top of the glass substrate could be the metal layer of the electrode in both OLEDs. The only difference between the two OLEDs is whether the OLED has the AgO$_x$ layer or not. The AgO$_x$ layer in OLED 2 is formed by the oxidation of the Ag layer through the UV-ozone treatment oxidation for 1 minute. The OLED 1 is not treated with the UV-ozone treatment. Other organic materials such as the m-MTDATA layer and the α-NPD layer are used as the organic hole transport layer and The Alq3 layer could be the organic electron transport layer and the green-fluorescence emitting layer. The sequences and the thicknesses of these organic layers in two OLEDs are the same. The LiF layer (0.5 nm)/the Al layer (1 nm)/the Ag layer (20 nm)/the TeO$_2$ layer (40 nm) could be used as the transparent cathode. The metal layer, the Ag layer, of the anode is the reflection anode. The lights of the two OLEDs are both emitted from the top transparent cathode. Under the same voltage, the current increase of the OLED 2 is more than that of the OLED 1. That is, the AgO$_x$ layer capable of improving the efficiency of the hole injecting to the OLED. The comparison of the luminance efficiency characteristic curves of the two OLEDs is shown in FIG. 11. Under the same current density, the luminance efficiency of the OLED 2 is more than that of the OLED 1. As the result, the OLED with the hole injection layer of the AgO$_x$ layer has a better luminance efficiency.

Figure 12:
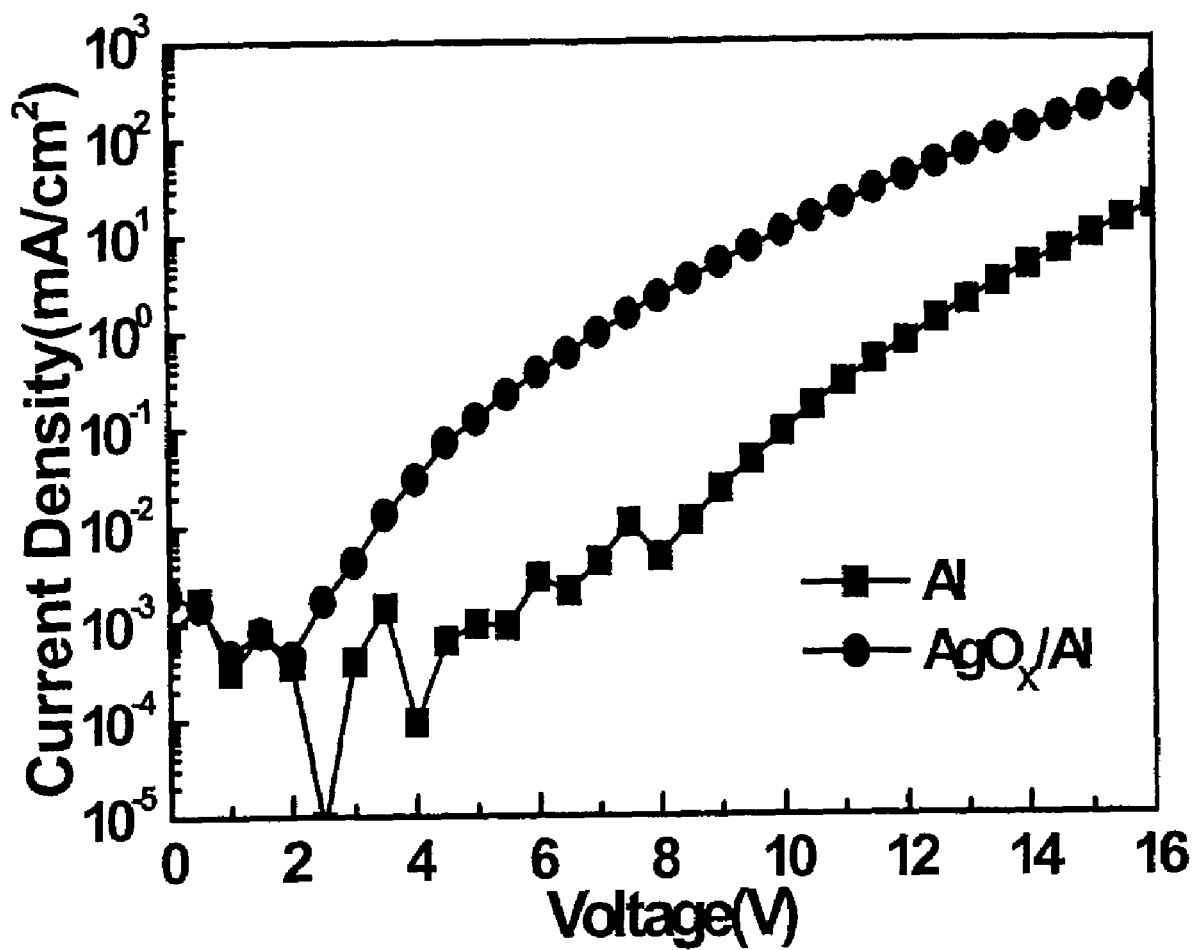
FIG. 12 is is a diagram showing the voltage-current characteristic curves of the OLED using the Al anode without $AgO_x$ (■) and with $AgO_x$ (●) according to a preferred embodiment of the present invention.

Furthermore, please refer to FIG. 12, which is the diagram showing the voltage-current characteristic curves of the OLED 1 (without a AgO$_x$ layer) and the OLED 2 (with a AgO$_x$ layer) according to the further preferred embodiments of the present application, in which:

OLED 1: the silicon substrate/the Al layer (100 nm)/the m-MTDATA layer (30 nm)/the α-NPD layer (20 nm)/the Alq3 layer (50 nm)/the LiF layer (0.5 nm)/the Al layer (1 nm)/the Ag layer (20 nm)/the TeO$_2$ layer (40 nm)

OLED 2: the silicon substrate/the Al layer (100 nm)/the AgO$_x$ layer/the m-MTDATA layer (30 nm)/the α-NPD layer (20 nm)/the Alq3 layer (50 nm)/the LiF layer (0.5 nm)/the Al layer (1 nm)/the Ag layer (20 nm)/the TeO$_2$ layer (40 nm)

The Al layer on top of the glass substrates could be the metal layers of the electrode structures in both two OLEDs. The only difference between the two OLEDs is whether the OLED has the AgO$_x$ layer or not. The AgO$_x$ layer in OLED 2 is formed by oxidizing the thin Ag film of 5 nm through the UV-ozone treatment oxidation for 1 minute. The OLED 1 is not treated with the UV-ozone treatment. Other organic materials such as m-MTDATA and α-NPD are the organic hole transport layers and the Alq3 layer could be the organic electron transport layer and the green-fluorescence emitting layer. The sequence and the thicknesses of the organic layers in two OLEDs are the same. The LiF layer (0.5 nm)/the Al layer (1 nm)/the Ag layer (20 nm)/the TeO$_2$ layer (40 nm) could be used as the transparent cathode. The metal layer, the thick Al film, of the electrode as the anode is the reflection anode. The lights of the two OLEDs are both emitted from the top transparent cathode. Under the same voltage, the current of the OLED 2 is more than that of the OLED 1. That is, the AgO$_x$ layer helpful to improve the efficiency of the hole injecting to the OLED.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. An organic light emitting diode, comprising:
   a substrate;
   a first electrode structure formed on said substrate;
   an organic layer formed on said first electrode structure; and
   a second transparent electrode structure having at least one transparent dielectric layer with a refraction index greater than 2.0 within a wavelength of visible light comprising a tellurium oxide layer.

2. The organic light emitting diode according to claim 1 wherein said first electrode structure is an anode.

3. The organic light emitting diode according to claim 1 wherein said second transparent electrode structure comprises a metal layer.

4. The organic light emitting diode according to claim 3 wherein said metal layer is one selected from a group consisting of layers of Al, Ag, Cr, and Mo, stack layers thereof and a layer of a mixture thereof.

5. The organic light emitting diode according to claim 3 wherein said metal layer has a thickness less than 40 nm.

6. The organic light emitting diode according to claim 1 wherein said second transparent electrode structure comprises an electron injection layer.

7. The organic light emitting diode according to claim 6 wherein said electron injection layer comprises an Al layer.

8. The organic light emitting diode according to claim 7 wherein said Al layer has a thickness less than 4 nm.

9. The organic light emitting diode according to claim 7 wherein said electron injection layer further comprises an alkali-salt layer.

10. The organic light emitting diode according to claim 9 wherein said alkali-salt layer has a thickness between 0.1 and 4 nm.

11. The organic light emitting diode according to claim 9 wherein said alkali-salt layer is deposited on said organic layer.

12. The organic light emitting diode according to claim 9 wherein said alkali-salt layer is one selected from a group consisting of layers of LiF, LiO2, and NaCl, stack layers thereof and a layer of a mixture thereof.

13. The organic light emitting diode according to claim 1 wherein said first electrode structure comprises a conductive layer.

14. The organic light emitting diode according to claim 13 wherein said conductive layer comprises a metal oxide layer.

15. The organic light emitting diode according to claim 14 wherein said conductive layer further comprises a conductive polymer layer formed on the metal oxide layer.

16. The organic light emitting diode according to claim 14 wherein said metal oxide layer is one selected from a group consisting of layers of indium tin oxide (ITO), indium zinc oxide (IZO), indium oxide, tin oxide, zinc oxide, aluminum zinc oxide (AZO), and tellurium oxide, stack layers thereof and a layer of a mixture thereof.

17. The organic light emitting diode according to claim 15 wherein said conductive polymer layer is one selected from a group consisting of layers of polyethylene dioxythiophene/ polystyrene sulphonate (PEDOT/PSS), 4,4',4"-tris(3-methylphenylphenylamino) triphenylamine (m-MTDATA), and polyaniline (PANI), stack layers thereof and a layer of a mixture thereof.

18. The organic light emitting diode according to claim 13 wherein said conductive layer comprises a metal layer.

19. The organic light emitting diode according to claim 18 wherein said conductive layer further comprises a metal oxide layer formed on said metal layer.

20. The organic light emitting diode according to claim 19 wherein said metal oxide layer is one selected from a group consisting of layers of indium tin oxide (ITO), indium zinc oxide (IZO), indium oxide, tin oxide, zinc oxide, aluminum zinc oxide (AZO), and tellurium oxide, stack layers thereof and a layer of a mixture thereof.

21. The organic light emitting diode according to claim 19 wherein said metal oxide layer is formed by a surface oxidation of said metal layer.

22. The organic light emitting diode according to claim 19 wherein said metal oxide layer is a silver oxide layer.

23. The organic light emitting diode according to claim 19 wherein said conductive layer further comprises a conductive polymer layer formed on said metal oxide layer.

24. The organic light emitting diode according to claim 23 wherein said conductive polymer layer is one selected from a group consisting of layers of polyethylene dioxythiophene/ polystyrene sulphonate (PEDOT/PSS), 4,4',4"-tris(3-methylphenylphenylamino) triphenylamine (m-MTDATA), and polyaniline (PANI), stack layers thereof and a layer of a mixture thereof.

25. The organic light emitting diode according to claim 18 wherein said conductive layer further comprises a conductive polymer layer formed on said metal layer.

26. The organic light emitting diode according to claim 25 wherein said conductive polymer layer is one selected from a group consisting of layers of polyethylene dioxythiophene/ polystyrene sulphonate (PEDOT/PSS), 4,4',4"-tris(3-methylphenylphenylamino) triphenylamine (m-MTDATA), and polyaniline (PANI), stack layers thereof and a layer of a mixture thereof.

27. The organic light emitting diode according to claim 14 wherein said metal oxide layer is an opaque metal oxide layer.

\* \* \* \* \*